United States Patent
Zhang

(10) Patent No.: US 9,010,950 B2
(45) Date of Patent: Apr. 21, 2015

(54) FIXING DEVICE AND BACKLIGHT MODULE USING THE FIXING DEVICE

(75) Inventor: Tian Zhang, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 587 days.

(21) Appl. No.: 13/380,882

(22) PCT Filed: Dec. 16, 2011

(86) PCT No.: PCT/CN2011/084112
§ 371 (c)(1),
(2), (4) Date: Dec. 26, 2011

(87) PCT Pub. No.: WO2013/086732
PCT Pub. Date: Jun. 20, 2013

(65) Prior Publication Data
US 2013/0155652 A1  Jun. 20, 2013

(30) Foreign Application Priority Data
Dec. 15, 2011 (CN) .......................... 2011 1 0418433

(51) Int. Cl.
*G09F 13/04* (2006.01)
*G09F 13/08* (2006.01)
*H05K 7/00* (2006.01)

(52) U.S. Cl.
CPC . *G09F 13/04* (2013.01); *H05K 7/00* (2013.01)

(58) Field of Classification Search
CPC .......... G02F 1/133615; G02F 2201/46; G02F 2201/465; G09F 13/04; H05K 7/00
USPC .................. 248/316.4; 349/58; 362/97.1, 457, 362/630–632
See application file for complete search history.

(56) References Cited

U.S. PATENT DOCUMENTS

2013/0141894 A1 * 6/2013 Yu et al. ....................... 362/97.2

FOREIGN PATENT DOCUMENTS

JP        2000234604 A  *  8/2000

* cited by examiner

*Primary Examiner* — Stephen F Husar

(57) ABSTRACT

Disclosed are a fixing device and a backlight module using the fixing device. The fixing device includes a positioning post, an embedded part, and at least one elastic part. The embedded part is vertically inserted in the positioning post. The at least one elastic part is disposed at one end of the positioning post. The fixing device of the present invention is capable of enhancing the structure and functions to position accurately. Furthermore, the elastic part is capable of decreasing shocks at the fixed position of the fixing device and improving the problem of stress concentration.

11 Claims, 2 Drawing Sheets

FIXING DEVICE AND BACKLIGHT MODULE USING THE FIXING DEVICE

BACKGROUND OF THE INVENTION

1. Field of the Invention

The present invention generally relates to a light guide plate technology field, and more particularly to a fixing device for a light guide plate or plates.

2. Description of Prior Art

A liquid crystal display device mainly comprises a liquid crystal panel and a backlight module. The backlight module is utilized for providing light for the liquid crystal panel when the liquid crystal panel displays images. A light guide plate of the backlight module is utilized for guiding the light to the liquid crystal panel.

Local dimming is a common technology used in the backlight module. Local dimming means that brightness and darkness in each of different areas of the backlight module can be controlled. A commonly used method for implementing the local dimming is to cut the light guide plate locally, or to cut the light guide plate into two ones and then the two ones are assembled, so as to achieve the control of brightness and darkness in each of different areas of the backlight module.

However, only paths of the light or disposed positions of the backlight module are concerned in the prior arts. A fixing device used for one light guide plate which is cut locally or for assembling two light guide plates is seldom provided, so that effect of local dimming is affected because of poor fixing methods of the light guide plate or plates.

Therefore, there is a need to solve the above-mentioned problem of lacking a fixing device for a light guide plate or plates.

SUMMARY OF THE INVENTION

An objective of the present invention is to provide a fixing device to solve the technical problem of lacking a fixing device for a light guide plate or plates in the prior arts.

To solve the above-mentioned problem, the present invention provides a fixing device, which comprises a positioning post, an embedded part, and at least one elastic part. The positioning post comprises a first part and a second part. The first part and the second part form a reverse T-shaped configuration. The embedded part is a threaded post and vertically inserted in the first part. The at least one elastic part is disposed at one end of the positioning post.

In the fixing device of the present invention, the elastic part is disposed at a border position between the first part and the embedded part.

In the fixing device of the present invention, the elastic part is disposed at a border position between the first part and the second part.

In the fixing device of the present invention, the embedded part is a screw.

To solve the above-mentioned problem, the present invention provides a fixing device, which comprises a positioning post, an embedded part, and at least one elastic part. The embedded part is vertically inserted in the positioning post. The at least one elastic part is disposed at one end of the positioning post.

In the fixing device of the present invention, the positioning post comprises a first part and a second part. The first part and the second part form a reverse T-shaped configuration. The embedded part is vertically inserted in the first part.

In the fixing device of the present invention, the elastic part is disposed at a border position between the first part and the embedded part.

In the fixing device of the present invention, the elastic part is disposed at a border position between the first part and the second part.

In the fixing device of the present invention, the embedded part is a threaded post.

Another objective of the present invention is to provide a backlight module to solve the technical problem of lacking a fixing device for a light guide plate or plates in the prior arts.

To solve the above-mentioned problem, the present invention provides a backlight module comprising a fixing device. The fixing device comprises a positioning post, an embedded part, and at least one elastic part. The embedded part is vertically inserted in the positioning post. The at least one elastic part is disposed at one end of the positioning post.

In the backlight module of the present invention, the positioning post comprises a first part and a second part. The first part and the second part form a reverse T-shaped configuration. The embedded part is vertically inserted in the first part.

In the backlight module of the present invention, the elastic part is disposed at a border position between the first part and the embedded part.

In the backlight module of the present invention, the elastic part is disposed at a border position between the first part and the second part.

In the backlight module of the present invention, the embedded part is a threaded post.

Compared with the prior arts, the present invention solves the technical problem of lacking a fixing device for a light guide plate or plates in the prior arts.

For a better understanding of the aforementioned content of the present invention, preferable embodiments are illustrated in accordance with the attached figures for further explanation:

DETAILED DESCRIPTION OF THE INVENTION

The following descriptions for the respective embodiments are specific embodiments capable of being implemented for illustrations of the present invention with referring to appended figures.

Figure 1:
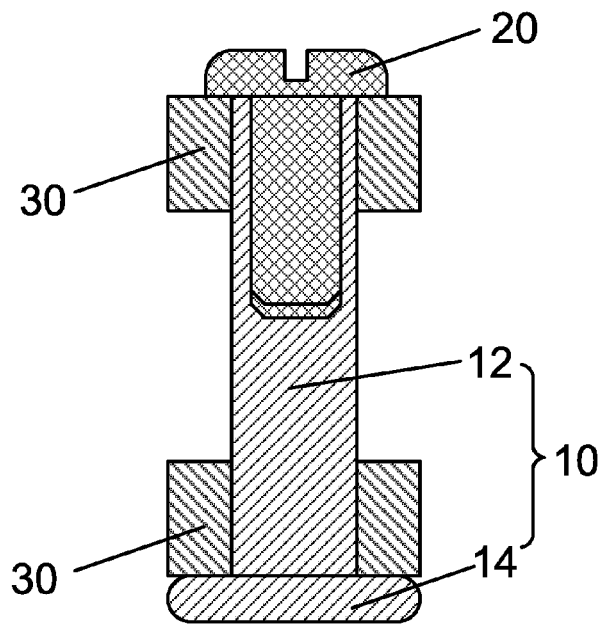
FIG. 1 shows a structural diagram of a fixing device according to a preferable embodiment of the present invention.

Please refer to FIG. 1, which shows a structural diagram of a fixing device according to a preferable embodiment of the present invention.

The fixing device comprises a positioning post 10, an embedded part 20, and at least one elastic part 30.

The positioning post 10 comprises a first part 12 and a second part 14. The first part 12 and the second part 14 form a reverse T-shaped configuration, that is, they are perpendicular to one another. The positioning post 10 is manufactured by a lathe method, and thus a shape thereof can be formed accurately. It is noted that the first part 12 and the second part 14 can be manufactured in one piece, or they can be respectively manufactured and then they are fixed to be the reverse T-shaped configuration.

The embedded part 20 is vertically inserted in the first part 12 of the positioning post 10. Preferredly, the embedded part 20 is a threaded post. In one embodiment, the embedded part 20 is a screw.

In the present embodiment, the fixing device comprises two elastic parts 30 which are respectively disposed at two ends of the positioning post 10. Specifically, a border position between the first part 12 and the embedded part 20 and a border position between the first part 12 and the second part 14 are respectively sheathed by the two elastic parts 30. It is noted that only one of the two elastic parts 30 is disposed at one end of the positioning post 10 as required.

Figure 2:
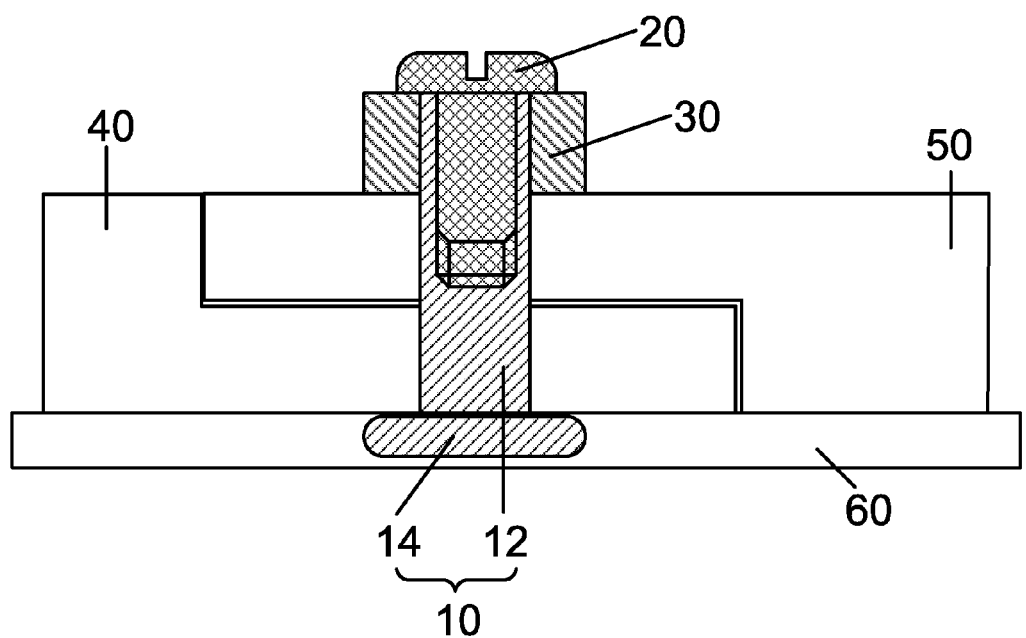
FIG. 2 shows that the fixing device is utilized for fixing two light guide plates according to a first embodiment of the present invention.

Please refer to FIG. 2, which shows that the fixing device is utilized for fixing two light guide plates according to a first embodiment of the present invention. As shown in FIG. 2, light guide plates 40, 50 are supported on a base plate 60, and they have corresponding shapes which can be assembled together.

In the present embodiment, the fixing device comprises only one elastic part 30. When the light guide plates 40, 50 are required to be fixed, the light guide plates 40, 50 are assembled firstly. Then, the first part 12 of the positioning post 10 is inserted in an area where the light guide plates 40, 50 contact with one another, so that the second part 14 of the positioning post 10 is fixed to the base plate 60 and the elastic part 30 leans on a top surface of at least one of the light guide plates 40, 50. In the present embodiment, the elastic part 30 leans on the top surface of the light guide plate 50. Finally, the embedded part 20 is inserted in the first part 12 of the positioning post 10 for finishing fixing the light guide plates 40, 50.

Figure 3:
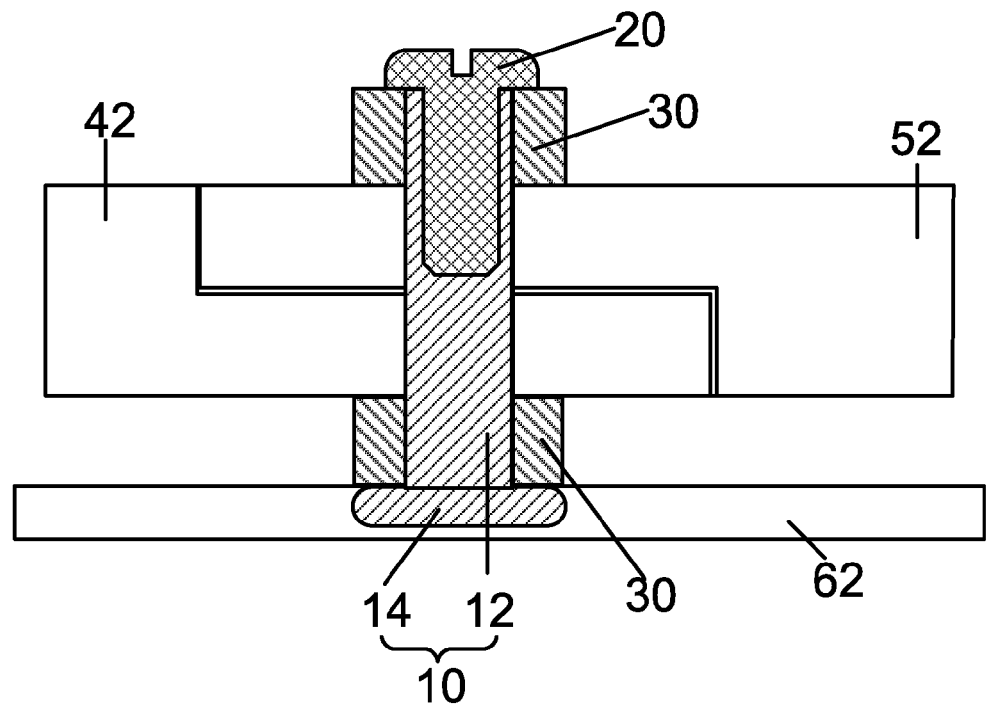
FIG. 3 shows that the fixing device is utilized for fixing two light guide plates according to a second embodiment of the present invention.

Please refer to FIG. 3, which shows that the fixing device is utilized for fixing two light guide plates according to a second embodiment of the present invention. As shown in FIG. 3, light guide plates 42, 52 have corresponding shapes which can be assembled together.

A difference between the first embodiment and the second embodiment is that the fixing device in the second embodiment comprises two elastic parts 30 which are respectively disposed at two ends of the first part 12 of the positioning post 10. Accordingly, the light guide plates 40, 50 which are assembled are positioned between the two elastic parts 30 at the two ends of the first part 12.

When the light guide plates 42, 52 are required to be fixed, the light guide plates 42, 52 are assembled firstly. Then, the first part 12 of the positioning post 10 is inserted in an area where the light guide plates 42, 52 contact with one another, so that the second part 14 of the positioning post 10 is fixed to a base plate 62 and the elastic part 30 in a higher position leans on a top surface of at least one of the light guide plates 42, 52. In the present embodiment, the elastic part 30 in the higher position leans on the top surface of the light guide plate 52, and the elastic part 30 in a lower position leans on a top surface of the base plate 62. Finally, the embedded part 20 is inserted in the first part 12 of the positioning post 10 for finishing fixing the light guide plates 42, 52.

Figure 4:
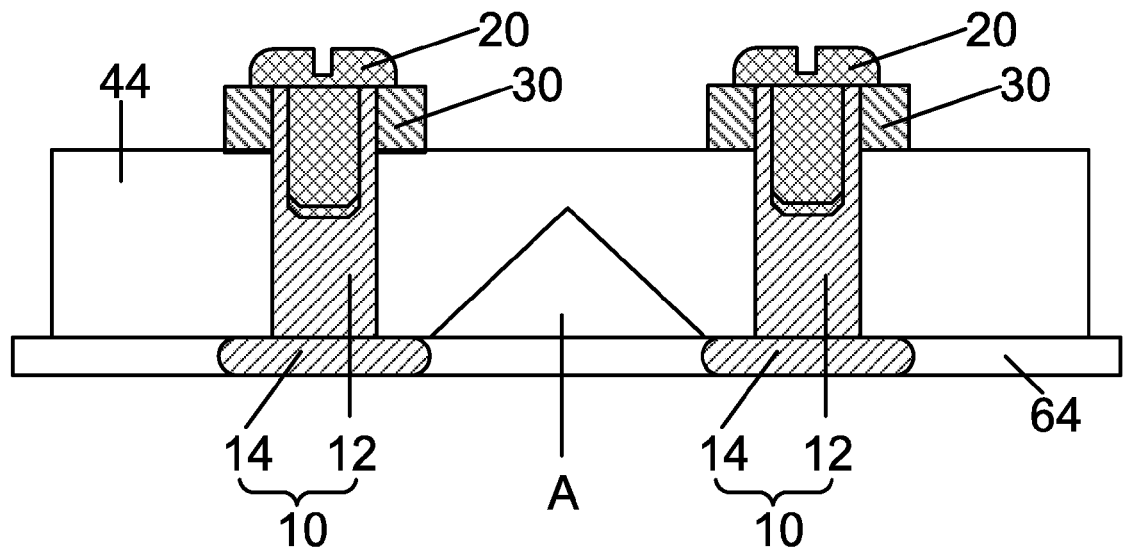
FIG. 4 shows that the fixing device is utilized for enhancing a structure of a light guide plate according to a preferable embodiment of the present invention.

Please refer to FIG. 4, which shows that the fixing device is utilized for enhancing a structure of a light guide plate according to a preferable embodiment of the present invention. As shown in FIG. 4, a light guide plate 44 is supported on a base plate 64. To achieve the objective of local dimming, a triangle part in a bottom area A of the liquid guide plate 44 is cut off, and thus the structure in the bottom area A is fragile.

When the structure in the bottom area A is required to be enhanced, the first part 12 of the positioning post 10 is inserted in a left side of the bottom area A of the light guide plate 44 firstly, so that the second part 14 of the positioning post 10 is fixed to the base plate 64 and the elastic part 30 leans on a top surface of the light guide plate 44. Finally, the embedded part 20 is inserted in the first part 12 of the positioning post 10 for enhancing the structure at the left side of the bottom area A.

Furthermore, a structure at a right side of the bottom area A can be enhanced by disposing the fixing device at the right side of the bottom area A. The processes are the same as the above-mentioned processes of disposing the fixing device of the present invention at the left side of the bottom area A and not described repeatedly herein.

The present invention further provides a backlight module, which comprises the fixing device provided by the present invention. The fixing device is described in detail as mentioned above, and thus the backlight module is not described repeatedly herein.

The fixing device of the present invention is capable of enhancing the structure and functions to position accurately. Furthermore, the elastic part 30 is capable of decreasing shocks at the fixed position of the fixing device and improving the problem of stress concentration.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A fixing device, comprising a positioning post, an embedded part, and at least one elastic part, wherein the positioning post comprises a first part and a second part, the first part and the second part form a reverse T-shaped configuration, the embedded part is a threaded post and vertically inserted in the first part, and the at least one elastic part is disposed at a border position between the first part and the second part.

2. The fixing device of claim 1, further comprising another elastic part disposed at a border position between the first part and the embedded part.

3. The fixing device of claim 1, wherein the embedded part is a screw.

4. A fixing device, comprising a positioning post, an embedded part, and at least one elastic part, wherein the embedded part is vertically inserted in the positioning post, the positioning post comprises a first part and a second part, and the at least one elastic part is disposed at a border position between the first part and the second part.

5. The fixing device of claim 4, wherein the first part and the second part form a reverse T-shaped configuration, and the embedded part is vertically inserted in the first part.

6. The fixing device of claim 5, further comprising another elastic part disposed at a border position between the first part and the embedded part.

7. The fixing device of claim 4, wherein the embedded part is a threaded post.

8. A backlight module, comprising a fixing device, the fixing device comprising a positioning post, an embedded part, and at least one elastic part, wherein the embedded part is vertically inserted in the positioning post, the positioning post comprises a first part and a second part, and the at least one elastic part is disposed at a border position between the first part and the second part.

9. The backlight module of claim 8, wherein the first part and the second part form a reverse T-shaped configuration, and the embedded part is vertically inserted in the first part.

10. The backlight module of claim 9, further comprising another elastic part disposed at a border position between the first part and the embedded part.

11. The backlight module of claim 8, wherein the embedded part is a threaded post.

* * * * *